United States Patent [19]

Sharma

[11] Patent Number: 4,855,602

[45] Date of Patent: Aug. 8, 1989

[54] BEAM DEFLECTOR

[76] Inventor: Devendra N. Sharma, 22, Carroll House, Barrie Estate, Gloucester Terr., London, England, W2 3PR

[21] Appl. No.: 175,626

[22] Filed: Mar. 30, 1988

Related U.S. Application Data

[63] Continuation of Ser. No. 881,092, Jul. 2, 1986, abandoned.

[30] Foreign Application Priority Data

Jun. 20, 1986 [GB] United Kingdom ................. 8615020

[51] Int. Cl.[4] ............................................. H01J 37/30

[52] U.S. Cl. ........................... 250/396 R; 250/423 R; 250/398; 250/492.3

[58] Field of Search ............... 250/493.1, 494.1, 492.1, 250/492.2, 492.3, 396 R, 396 ML, 398, 423 R; 219/121 LS, 121 LW, 121 EV; 313/361.1

[56] References Cited

U.S. PATENT DOCUMENTS

| | | | |
|---|---|---|---|
| 3,434,894 | 3/1969 | Gale | 250/492.2 |
| 3,547,074 | 12/1970 | Hirschfeld | 250/398 |
| 3,705,320 | 12/1972 | Freeman | 313/363.1 |
| 3,932,726 | 1/1976 | Verheyen et al. | 219/121 LM |
| 3,947,688 | 3/1976 | Massey | 250/495 |
| 4,426,583 | 1/1984 | Chang et al. | 250/398 |
| 4,573,465 | 3/1986 | Sugiyama et al. | 128/303.1 |
| 4,584,455 | 4/1986 | Tomizawa | 219/121 LH |

FOREIGN PATENT DOCUMENTS

| | | | |
|---|---|---|---|
| 0150941 | 8/1985 | European Pat. Off. | 250/398 |
| 1252569 | 11/1971 | United Kingdom | 313/360.1 |

*Primary Examiner*—Bruce C. Anderson
*Attorney, Agent, or Firm*—Fleit, Jacobson, Cohn, Price, Holman & Stern

[57] ABSTRACT

An apparatus for forming a beam includes a housing, electromagnetic coils and/or electrostatic devices for combining a plurality of individual beams into a single beam. Deflection mirrors can be used to deflect the combined beam in a predetermined direction. The beams so combined can include beams of a constant wave or beams in pulse formation. The electromagnetic energy may include visible and non-visible rays, infrared rays, as well as particles. Laser beams can be used employing CO2 X-rays, and Argon, among others. The application has navigational, medicinal, and military uses, among other such as total disruption of enemy's guidance, communication and detection devices employing radar. Also, total incapability of "heat-seeking" aircraft destruction devices to be effective against aircraft fitted with this invention.

2 Claims, 2 Drawing Sheets

BEAM DEFLECTOR

This is a continuation of application Ser. No. 881,092 filed July 2, 1986, now abandoned.

BACKGROUND OF THE INVENTION

The present invention relates to formation of beams, and in particular to beams of electromagnetic beam radiation such as laser, particle, visible, and invisible radiation.

Particle accelerators are known in the prior art. Such particle accelerators control the flow and direction of particles by way of magnetic fields generated by coils. These are used in such well-known devices as particle accelerators used in the study of particle physics.

SUMMARY OF THE INVENTION

The present invention combines several beams of particles into a single beam which can be deflected by mirrors or deflection plates, or another device such as a pair of electrostatic plates.

The device according to the present invention includes an ionization chamber, a magnetic coil for generating a magnetic field, an inlet for several beams, electrostatic plates, deflection plates, and a movable mounting.

DETAILED DESCRIPTION OF THE INVENTION

Figure 1:
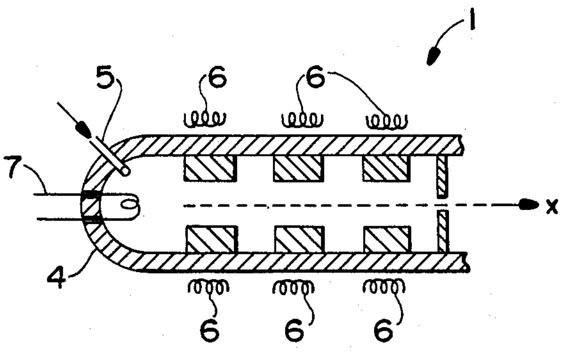
FIG. 1 is a side sectional view of an individual ionization chamber.

FIG. 1 shows in section an ionization chamber having a gas inlet 5, which includes a ball valve, and a vessel wall 4. A coil 7 causes ionization of the gas particles from the inlet 5, these particles then being accelerated via coil 6 to form a beam X which exits from an aperture in the wall 4.

Figure 2:
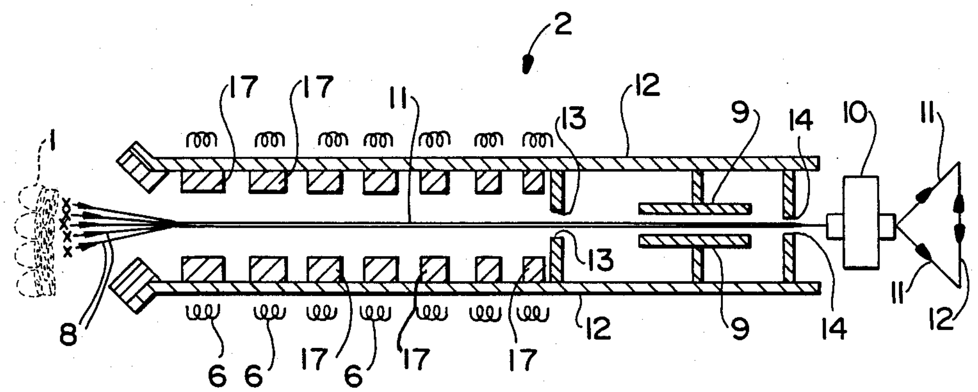
FIG. 2 is a side sectional view of a device according to the present invention.

FIG. 2 illustrates a plurality of beams X, indicated in FIG. 2 as beams 8, being combined into a single beam 11 by an apparatus according to the present invention. The device 2 has walls 12 surrounded by a plurality of coils 6 which generate an electromagnetic field, as is known.

A plurality of beams 8, composed of individual beams X such as are generated by the device of FIG. 1, are combined in the device 2 such that the beams are combined into a single beam 11 which passes through an aperture 13. The combined beam 11 next passes between a pair of plates 9,9 which preferably have electrostatic charges thereon so as to controllably deflect the beam.

This deflected beam then passes through aperture 14 and is received by a reflecting device 10 which is capable of causing the output beam 11 to be scanned through a range 12.

Figure 3:
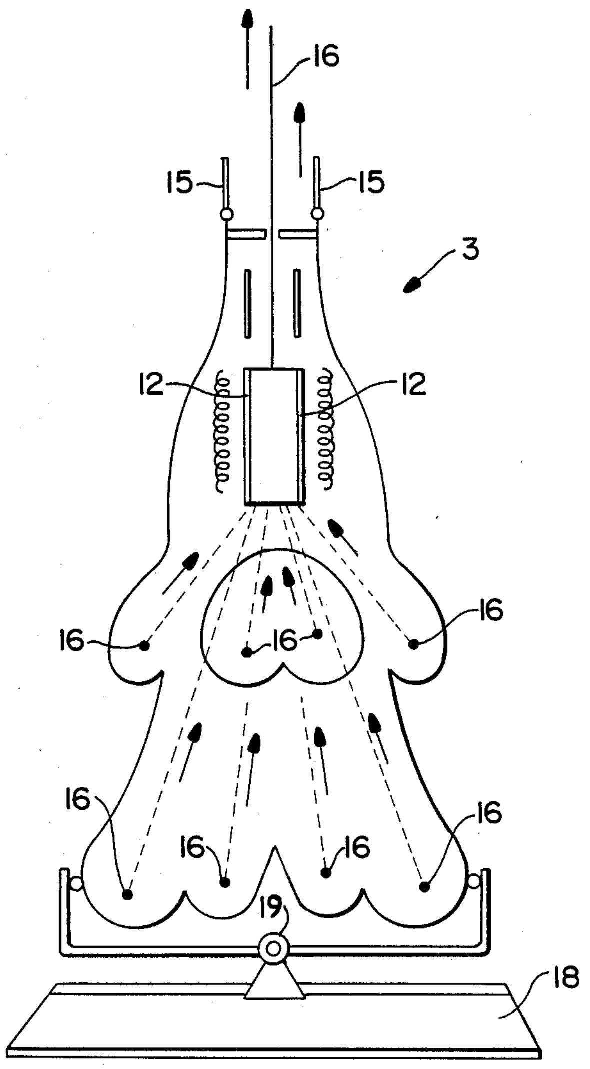
FIG. 3 is a side schematic view of a deivce according to the presnt invention and which is pivotably mounted.

FIG. 3 illustrates mounting of a device such as the device of FIG. 2, together with a plurality of beam interchangeable sources 16. The device 3 is mounted for motion from side to side, in a circular direction, and backward or forward, by the combination of a stand 18 and a pivot mounting 19. The stand 18 is preferably rotatably mounted to permit rotation of the pivot mounting 19, and the pivot mounting 19 permits rotation about a pivot pin indicated schematically in FIG. 3.

The apparatus 3 of FIG. 3 combines a plurality of beams from the sources 16, which are indicated by small arrows in FIG. 3, into a single output beam 16. The output beam passes between a pair of deflecting plates 15,15 which may advantageously be electrostatically charged. Alternatively, the deflectors 15 can be other devices, such as electromagnetic devices, which are capable of affecting the beams so combined, including hinged mirrors.

The apparatus shown in FIG. 3 can be mounted upon a mobile vehicle or aircraft if so desired. Cooling of the main shell 12 is appropriately effected by water or air by any well-known methods such as those employed for motor vehicles.

In operation, a plurality of sources of beams 16 are used. These sources 16 supply waves either as constant waves or in pulse formation, the beams being either visible or non-visible. The beams can also include infrared radiation, particles, and maybe in the form of a laser beam formation employing CO2, X-rays, Argon etc.

The intense beam formation may be used in a "Strategic Defense Initiative" (so called "Star Wars"), or for industrial use, as well as for power transmission, medical uses, and military requirements.

It is noted in FIG. 2 that solid block 17 denotes devices which can be used for providing an electrostatic charge for controlling the beam. These devices are produced by any known means.

The beam sources, namely sources 16 in FIG. 3, are combined by mirrors, electrostatic means, or magnetic means to form the single beam. The individual beams which are so combined may be all at a single frequency, or the various beams may be at different frequencies.

The combined beam so produced may be used in military applications, medicinal applications, as well as having offensive military uses, defensive military uses, and for providing navigational support either alone or in association with computers.

While a preferred embodiment has been discussed and illustrated it will be understood that the present invention is not limited thereto but may be otherwise embodied within the scope of the following claims:

What is claimed is:

1. An apparatus for producing a single output particle beam from a plurality of individual particle beams, comprising:

a plurality of individual particle beam sources for each providing an individual particle beam, each of said individual particle beam sources including a vessel wall, a gas inlet inlet in said vessel wall, ionizing coil means for ionizing gas particles from said gas inlet, and accelerating coil means for accelerating ionized gas particles into an individual particle beam;

beam combining means for combining individual particle beams simultaneously output from said plurality of individual particle beam sources into a single combined output particle beam, sid beam combining means including means for generating an electromagnetic field;

beam deflector means for deflecting said single combined output particle beam, said beam deflector means including a means for producing a deflecting electromagnetic field for controllably deflecting said single combined output particle beam; and beam scanning means for scanning the deflected single combined output particle beam through a scanning range.

2. The apparatus according to claim 1, wherein said beam combining means, said beam deflector means and said beam scanning means are mounted in a housing having an inlet aperture for receiving said plurality of individual particle beams and an outlet aperture for passing said deflected single combined output particle beam therethrough, said housing having a mounting means for pivotably and rotatably supporting said housing.

* * * * *